US008120076B2

(12) United States Patent  
Yang

(10) Patent No.: US 8,120,076 B2  
(45) Date of Patent: Feb. 21, 2012

(54) METHOD AND STRUCTURE OF MONOLITHICALLY INTEGRATED INFRARED SENSING DEVICE

(76) Inventor: Xiao (Charles) Yang, Cupertino, CA (US)

(*) Notice: Subject to any disclaimer, the term of this patent is extended or adjusted under 35 U.S.C. 154(b) by 68 days.

(21) Appl. No.: 12/511,004

(22) Filed: Jul. 28, 2009

(65) Prior Publication Data

US 2010/0187580 A1 Jul. 29, 2010

Related U.S. Application Data

(60) Provisional application No. 61/084,223, filed on Jul. 28, 2008.

(51) Int. Cl.
*H01L 31/062* (2006.01)
*H01L 31/113* (2006.01)

(52) U.S. Cl. .......... 257/291; 257/290; 257/E31.11; 257/E31.093

(58) Field of Classification Search ............ 257/290, 257/291, E27.131, E31.11, E31.093
See application file for complete search history.

(56) References Cited

U.S. PATENT DOCUMENTS

| | | | | |
|---|---|---|---|---|
| 5,808,350 | A * | 9/1998 | Jack et al. | 257/440 |
| 6,307,194 | B1 * | 10/2001 | Fitzgibbons et al. | 250/208.1 |
| 7,538,311 | B2 * | 5/2009 | Watanabe | 250/226 |
| 2002/0039838 | A1 * | 4/2002 | Iida et al. | 438/689 |
| 2002/0190210 | A1 * | 12/2002 | Ishikawa et al. | 250/338.4 |
| 2005/0224714 | A1 * | 10/2005 | Akin et al. | 250/332 |
| 2006/0087430 | A1 * | 4/2006 | Zambon | 340/567 |
| 2006/0244067 | A1 * | 11/2006 | Socher et al. | 257/350 |

OTHER PUBLICATIONS

Radford et al., "Microbolometer Uncooled Infrared Camera With 20 mK NETD," SPIE Conf. on Infrared Technology and Applications XXIV, SPIE vol. 3436, pp. 636-646, Jul. 1998.*
Cole et al., "Monolithic Two-Dimensional Arrays of Micromachined Microstructures for Infrared Applications," Proceedings of the IEEE, vol. 86, No. 8, pp. 1679-1686, Aug. 1998.*
Amantea et al., "An Uncooled IR Imager with 5 mK NEDT," SPIE vol. 3061, pp. 210-222, 1997.*

* cited by examiner

*Primary Examiner* — Jarrett Stark
(74) *Attorney, Agent, or Firm* — Kilpatrick Townsend & Stockton LLP

(57) ABSTRACT

Protection for infrared sensing device, and more particularly, to a monolithically integrated uncooled infrared sensing device using IC foundry compatible processes. The proposed infrared sensing device is fabricated on a completed IC substrate. In an embodiment, the infrared sensing device has a single crystal silicon plate with an absorbing layer supported a pair of springs. The absorbing layer absorbs infrared radiation and heats up the underlying silicon layer. As a result, an n well in the silicon layer changes its resistance related to its temperature coefficient of resistance (TCR). In another embodiment, the infrared sensing device has a top sensing plate supported by an underlying spring structures. The top sensing plate has sensing materials such as amorphous silicon, poly silicon, SiC, SiGe, Vanadium oxide, or YbaCuO. Finally, a micro lens array is placed on top of the sensing pixel array with a gap in between. In an embodiment, the micro lens array is fabricated on a silicon substrate and bonded to the sensing pixel array substrate. In another embodiment, the micro lens array is fabricated monolithically using amorphous silicon. The micro lens array layer encapsulates the pixel sensing array hermetically, preferably in a vacuum environment.

7 Claims, 4 Drawing Sheets

METHOD AND STRUCTURE OF MONOLITHICALLY INTEGRATED INFRARED SENSING DEVICE

CROSS-REFERENCES TO RELATED APPLICATIONS

This application claims priority to U.S. Provisional Patent Application Ser. No. 61/084,223, filed Jul. 28, 2008, entitled "METHOD AND STRUCTURE OF MONOLITHICALLY INTEGRATED INFRARED SENSING DEVICE" by inventor XIAO (CHARLES) YANG commonly assigned and incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

This present invention relates in general to protection of infrared sensing device, and more particularly, to a monolithically integrated uncooled infrared sensing device using IC foundry compatible processes.

Uncooled infrared detectors have recently gained wide attention for infrared imaging applications, due to their advantages such as low cost, low weight, low power, large spectral response, and long-term operation compared to those of photon detectors. Worldwide effort is still continuing to implement very large format arrays at low cost for use in various applications, including commercial applications such as driver's night vision enhancement and fire fighting. One of the main issues for achieving low-cost detectors is their monolithic integration and compatibility with CMOS technology.

The most widely used uncooled detector approach is to implement microbolometers using surface micromachined bridges on CMOS processed wafers, where infrared radiation increases the temperature of a material formed on the thermally isolated and suspended bridge, causing a change in its resistance related to its temperature coefficient of resistance (TCR). Vanadium oxide, which is the most widely known and used microbolometer material, has a high TCR of about 2-3%/K; however, Vanadium oxide is not a standard material in IC fabrication and requires dedicated expensive equipment to prevent contamination of the CMOS line. In addition, it exhibits large noise due to its monocrystalline structure. There are efforts to implement surface micromachined microbolometers using IC compatible materials such as amorphous silicon, amorphous silicon carbide, and polycrystalline silicon-germanium; and these materials also have high TCR values of 2.5%/K, 4-6%/K, and 2-3%/K, respectively. However, these materials require high temperature annealing to reduce their residual stress, which is not suitable for post-CMOS processing for monolithic integration. In addition, they exhibit even higher noise than Vanadium oxide due to their monocrystalline structures.

Thus, it is desirable to improve incumbent infrared sensing devices.

BRIEF SUMMARY OF THE INVENTION

This present invention relates in general to protection of infrared sensing device, and more particularly, to a monolithically integrated uncooled infrared sensing device using IC foundry compatible processes.

The proposed infrared sensing device is fabricated on a completed IC substrate. In an embodiment, the infrared sensing device comprises single crystal silicon plate with an absorbing layer supported a pair of springs. The absorbing layer absorbs infrared radiation and heats up the underlying silicon layer. As a result, a n well in the silicon layer changes its resistance related to its temperature coefficient of resistance (TCR). In another embodiment, the infrared sensing device comprises a top sensing plate supported by an underlying spring structures. The top sensing plate has sensing materials such as amorphous silicon, poly silicon, SiC, SiGe, Vanadium oxide, or YbaCuO. Finally, a micro lens array is placed on top of the sensing pixel array with a gap in between. In an embodiment, the micro lens array is fabricated on a silicon substrate and bonded to the sensing pixel array substrate. In another embodiment, the micro lens array is fabricated monolithically using amorphous silicon. The micro lens array layer encapsulates the pixel sensing array hermetically, preferably in a vacuum environment.

DETAILED DESCRIPTION OF THE INVENTION

According to the present invention, techniques for fabricating infrared sensing device are provided. More particularly, the invention includes a method and structure for fabricating infrared sensing device with IC foundry compatible processes. Merely by way of example, the invention has been applied to fabricating infrared sensing device. But it would be recognized that the invention has a much broader range of applicability.

Figure 1:
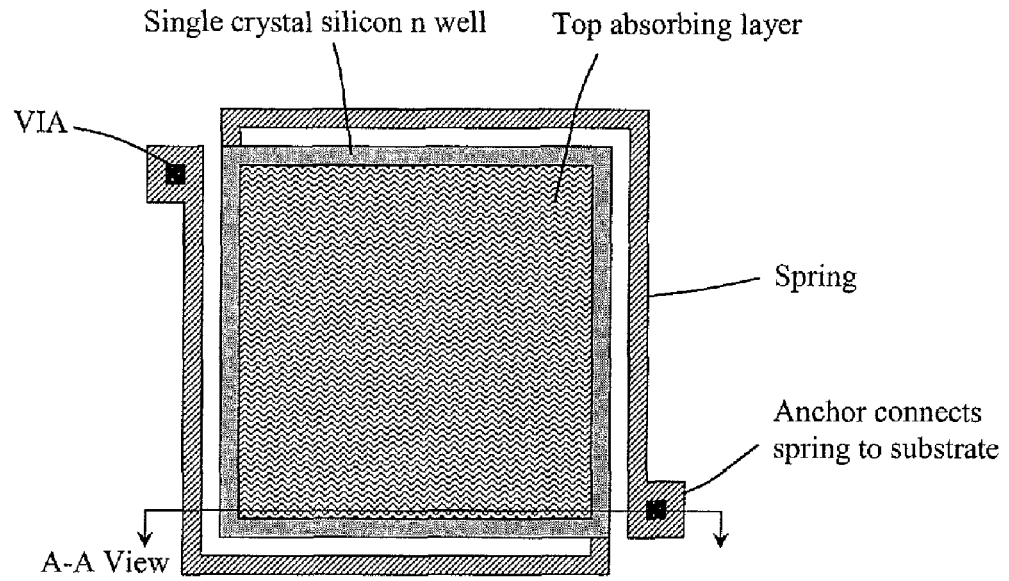
FIG. 1 is a simplified diagram illustrating components of an infrared sensing device according to one embodiment of the present invention.
Figure 1:
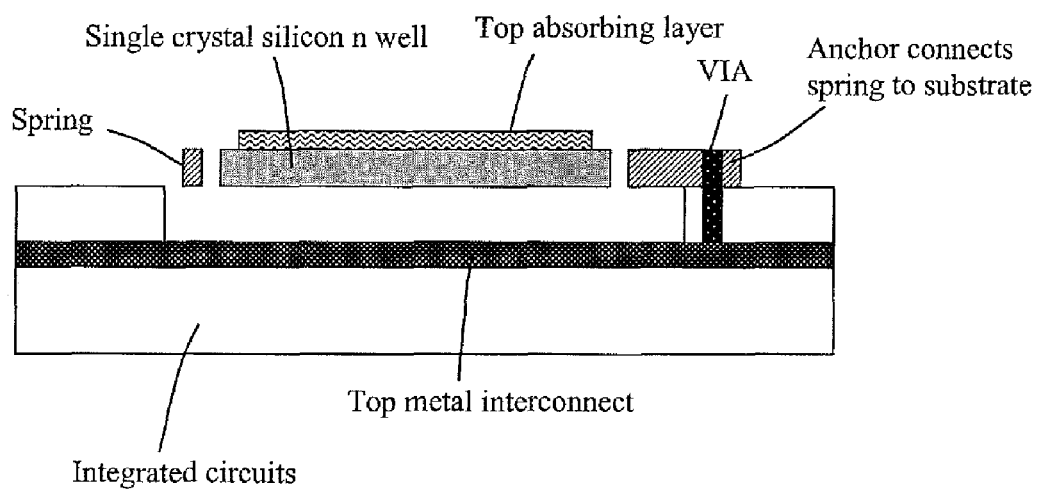

FIG. 1 is a simplified diagram illustrating components of an infrared sensing device according to one embodiment of the present invention. The following diagrams are merely examples, which should not unduly limit the scope of the claims herein. One of ordinary skill in the art would recognize many variations, alternatives, and modifications.

As illustrated, the infrared sensing device has a single crystal silicon plate with an absorbing layer supported a pair of springs. As shown in A-A cross section view, the springs are anchored to the substrate and electrically connected to the top metal through VIAs. The absorbing layer absorbs infrared radiation and heats up the underlying silicon layer. As a result, a n-well in the silicon layer changes its resistance related to its temperature coefficient of resistance (TCR). The change in resistance is detected by the underlying integrated circuits.

Figure 2:
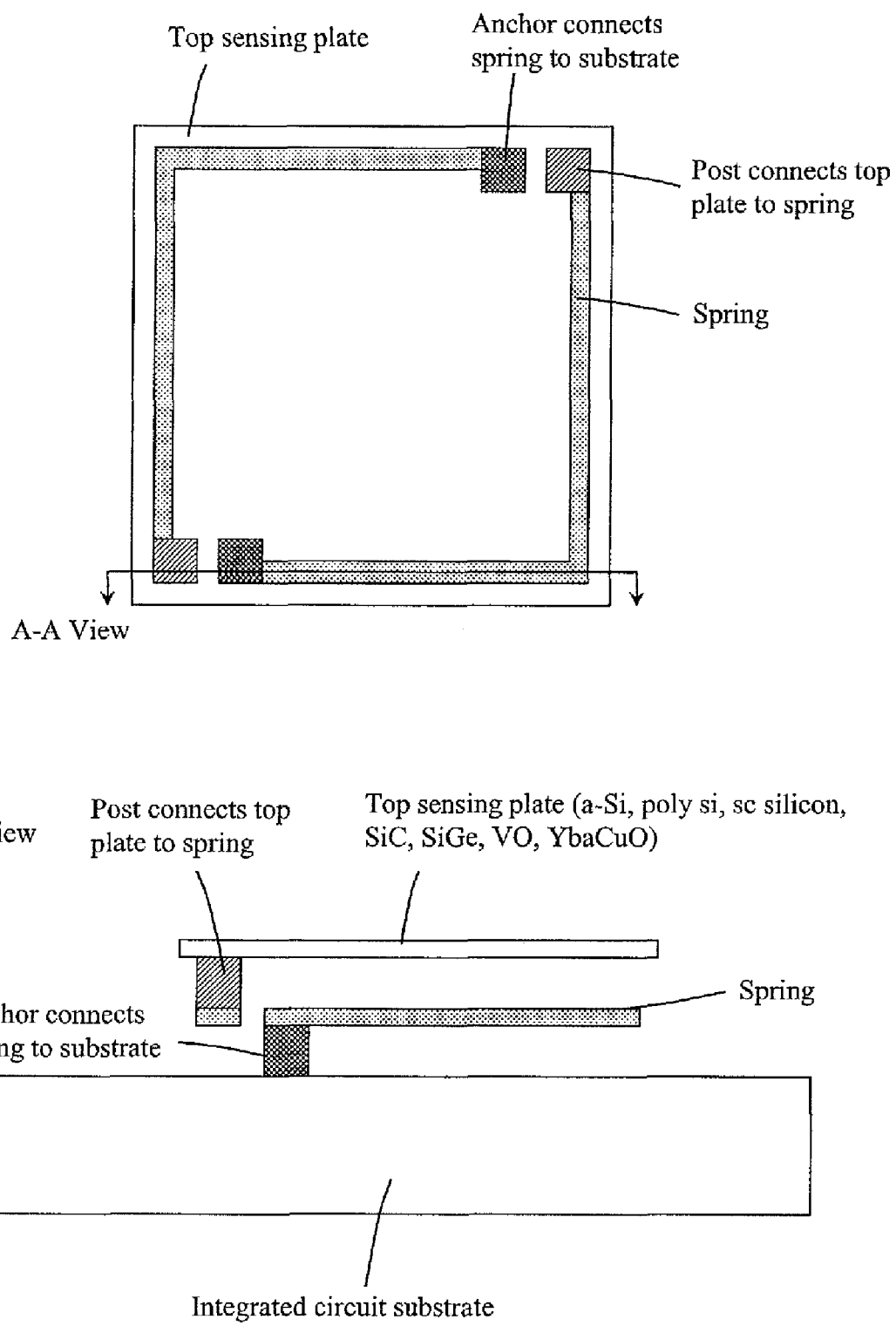
FIG. 2 is a simplified diagram illustrating components of an infrared sensing device according to one embodiment of the present invention.

FIG. 2 is a simplified diagram illustrating components of an infrared sensing device according to one embodiment of the present invention. Infrared sensing device has a top sensing plate supported by an underlying spring structures. The top sensing plate has sensing materials such as amorphous silicon, poly silicon, SiC, SiGe, Vanadium oxide, or YbaCuO, among others. As shown in A-A cross section view, the top plate is connected to the spring structures via posts. The springs are anchored to the substrate and electrically connected to the top metal through VIAs.

Figure 3:
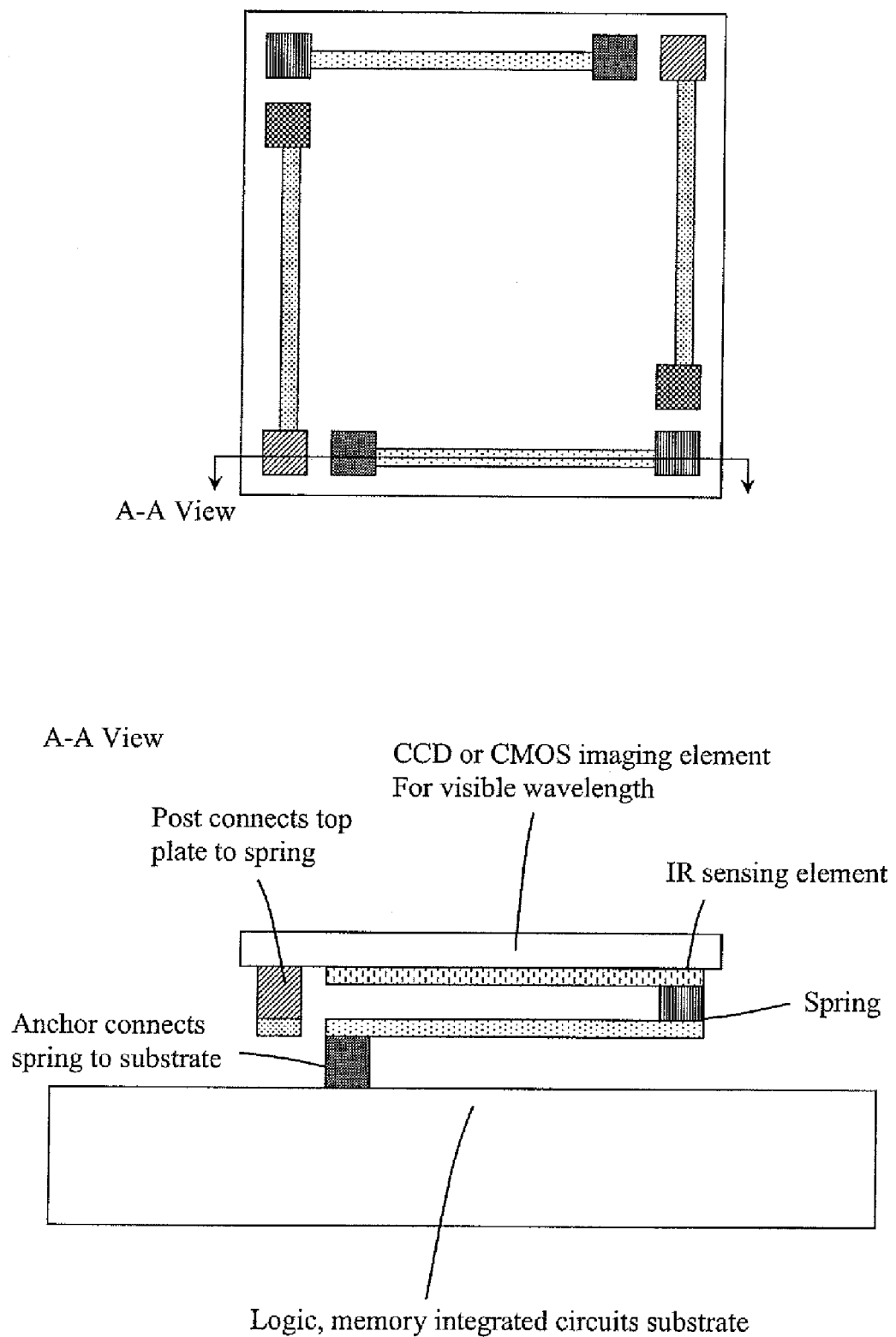
FIG. 3 is a simplified diagram illustrating components of an infrared sensing device according to one embodiment of the present invention.

FIG. 3 is a simplified diagram illustrating components of an infrared sensing device according to one embodiment of the present invention. Infrared sensing device has a sensing plate supported by an underlying spring structures. The sensing plate has a top layer and a bottom layer. The top layer is a CCD or CMOS imaging element that sense visible wavelength. The bottom layer is an infrared sensing material such as amorphous silicon, poly silicon, SiC, SiGe, Vanadium oxide, or YbaCuO, among others. As shown in A-A cross section view, the top layer is mechanically and electrically connected to one pair of spring structures; and the bottom layer is mechanically and electrically connected to the other pair of spring structures. The springs are anchored to the substrate and electrically connected to the top metal through VIAs.

Figure 4:
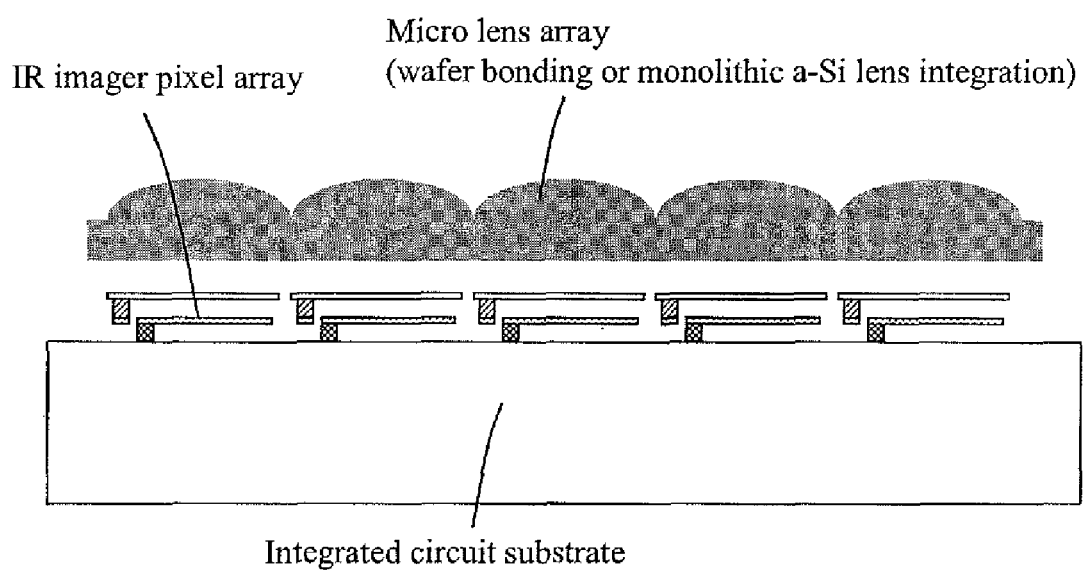
FIG. 4 is a simplified block diagram illustrating of an array of infrared sensing devices according to one embodiment of the present invention.

FIG. 4 is a simplified block diagram illustrating of an array of infrared sensing devices according to one embodiment of the present invention. As depicted, an array of infrared sensing elements or pixels is fabricated on top of the IC substrate. A micro lens array is placed on top of the sensing pixel array with a gap in between. In an embodiment, the micro lens array is fabricated on a silicon substrate and bonded to the sensing pixel array substrate. In another embodiment, the micro lens array is fabricated monolithically using amorphous silicon. The micro lens array layer encapsulates the pixel sensing array hermetically, preferably in a vacuum environment.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated imager and CMOS integrated circuit device comprising:
    a semiconductor substrate having a surface region;
    a CMOS integrated circuit device region overlying the surface region;
    a dielectric material overlying the CMOS integrated circuit device region;
    one or more infrared (IR) sensing devices overlying the dielectric material, the IR sensing device(s) being coupled to the CMOS integrated circuit device region, the IR sensing device(s) each having a sensing plate supported by a pair of springs, wherein the sensing plate comprises a top layer and a bottom layer, the top layer comprising a CCD or CMOS imaging element that senses visible wavelengths; and
    one or more micro lens devices coupled to the one or more IR sensing devices.

2. The device of claim 1 wherein the sensing plate comprises a material selected from amorphous silicon, polysilicon, silicon carbide, silicon, germanium, vanadium oxide, or YBaCuO.

3. The device of claim 1 wherein each pair of springs of each IR sensing device is coupled to the semiconductor substrate via a pair of anchors.

4. The device of claim 1 wherein the bottom layer comprises an infrared sensing material.

5. The device of claim 1 wherein the one or more IR sensing devices comprise an array of IR sensing pixels.

6. The device of claim 5 wherein the one or more lens devices comprise and array of micro lenses, the micro lens array encapsulating the IR sensing pixel array.

7. The device of claim 1 wherein the CMOS integrated circuit device region includes logic integrated circuits.

* * * * *